United States Patent
Inoue

(10) Patent No.: US 9,710,905 B2
(45) Date of Patent: Jul. 18, 2017

(54) MASK INSPECTION APPARATUS AND MASK INSPECTION METHOD

(71) Applicant: NuFlare Technology, Inc., Yokohama (JP)

(72) Inventor: Takafumi Inoue, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 221 days.

(21) Appl. No.: 14/796,327

(22) Filed: Jul. 10, 2015

(65) Prior Publication Data

US 2016/0019689 A1    Jan. 21, 2016

(30) Foreign Application Priority Data

Jul. 15, 2014 (JP) ................................ 2014-145114

(51) Int. Cl.
*G06K 9/00* (2006.01)
*G06T 7/00* (2017.01)
*G03F 1/84* (2012.01)

(52) U.S. Cl.
CPC ............... *G06T 7/001* (2013.01); *G03F 1/84* (2013.01); *G06T 2207/20224* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 4,513,316 A | * | 4/1985 | Kobayashi | G01N 21/88 348/133 |
| 6,456,318 B1 | * | 9/2002 | Noguchi | G01N 21/95607 348/126 |
| 8,923,600 B2 | * | 12/2014 | Zafar | G03F 1/84 382/144 |
| 2002/0181756 A1 | * | 12/2002 | Shibuya | G01N 21/956 382/145 |
| 2003/0007677 A1 | * | 1/2003 | Hiroi | G06T 7/001 382/149 |

(Continued)

FOREIGN PATENT DOCUMENTS

JP    2010-71893    4/2010

*Primary Examiner* — Iman K Kholdebarin
(74) *Attorney, Agent, or Firm* — Oblon, McClelland, Maier & Neustadt, L.L.P.

(57) ABSTRACT

In a mask inspection apparatus, a defect detection unit includes a first memory region, a second memory region, an inspection condition reconfiguring unit, and a comparison unit. The inspection condition reconfiguring unit obtains a difference between gray scales of an optical image stored in the second memory region and a reference image stored in the first memory region. The existence of the defect is determined in the case where the difference is larger than a first threshold value. Further in the case where the number of defects is larger than a second threshold value, an inspection condition is re-estimated and configured and the reference image is regenerated. A comparison unit compares the stored reference image with the stored optical image in the case where the inspection condition is not reconfigured, and compares the regenerated reference image with the stored optical image in the case where the inspection condition is reconfigured.

20 Claims, 8 Drawing Sheets

(56) References Cited

U.S. PATENT DOCUMENTS

| | | | | |
|---|---|---|---|---|
| 2005/0110987 A1* | 5/2005 | Furman | ............ | G01N 21/8806 |
| | | | | 356/237.4 |
| 2005/0232477 A1* | 10/2005 | Sugihara | ................ | G06T 7/001 |
| | | | | 382/149 |
| 2006/0181700 A1* | 8/2006 | Andrews | ................ | G01N 21/21 |
| | | | | 356/237.2 |
| 2009/0091752 A1* | 4/2009 | Terasawa | ............... | G01N 21/47 |
| | | | | 356/237.5 |
| 2009/0324055 A1* | 12/2009 | Auerbach | ............ | G06K 9/3233 |
| | | | | 382/145 |
| 2011/0188734 A1* | 8/2011 | Tsuchiya | .............. | G06T 7/0002 |
| | | | | 382/149 |
| 2016/0292839 A1* | 10/2016 | Inoue | ..................... | G06T 7/001 |

* cited by examiner

MASK INSPECTION APPARATUS AND MASK INSPECTION METHOD

CROSS-REFERENCE TO THE RELATED APPLICATION

The entire disclosure of the Japanese Patent Application No. 2014-145114, filed on Jul. 15, 2014 including specification, claims, drawings, and summary, on which the Convention priority of the present application is based, are incorporated herein in its entirety.

FIELD OF THE INVENTION

The present invention relates to a mask inspection apparatus and a mask inspection method.

BACKGROUND

Recently, higher mounting densities and larger capacities of large-scale integrated (LSI: Large Scale Integration) circuits are further reducing the circuit line widths needed for semiconductor devices. By using an original image pattern (that is, a mask or a reticle, hereinafter collectively referred to as a mask) in which a circuit pattern is formed, the pattern is exposed and transferred onto a wafer by a reduction projection exposure apparatus, called a stepper or a scanner, to form a circuit on the wafer, thereby producing a semiconductor element.

Since LSI production requires a large manufacturing cost, it is crucial to improve the production yield. On the other hand, in a contemporary semiconductor device, a pattern having a line width from ten nanometers to twenty nanometers is required to be formed. At this point, a defect of the mask pattern can be cited as a large factor of degradation in the production yield. As the dimensions of an LSI pattern to be formed on a semiconductor wafer become finer, so too will the defects of the mask pattern become finer.

As fluctuations of various process conditions are absorbed by enhancing dimensional accuracy of the mask, it is necessary to detect the defect of the extremely small pattern in a mask inspection. Therefore, high accuracy is required for a mask inspection apparatus that inspects patterns of a mask.

In the mask inspection apparatus, light emitted from a light source is irradiated onto a mask through an optical system. The mask is loaded and chucked on a stage, and the illuminated light scans the mask by movement of the stage. The light transmitted through or reflected by the mask, images on a sensor through lenses of an optical system. Then, the defect inspection with respect to the mask is performed based on the optical images acquired by the sensor.

A die-to-die comparison inspection method and a die-to-database comparison inspection method are known as examples of mask inspection methods performed using the mask inspection apparatus. In the die-to-die comparison method, an optical image of a pattern and another optical image of the identical pattern at a different position are compared with each other. On the other hand, in the die-to-database comparison method, a reference image generated from design data used in mask production and an optical image of the actual pattern formed in the mask are compared with each other.

The optical image is generated by using a charge accumulation type time delay integration (TDI) sensor and a sensor amplifier that amplifies an output of the TDI sensor. In a case where the inspection is performed by the transmitted light, for example, a half-tone type phase shift mask can obtain the contrast of a light blocking film and a glass substrate to some degree. Therefore, like a chromium mask, there is adopted a method of performing defect determination by recognizing mask patterns through a light intensity signal of a sensor image that receives light by a detection optical system.

Depending on the shape of the defect, there is a case where the contrast is easily obtained by using light reflected from a surface of a mask, and there is an inspection method using a reflection inspection optical system for the purpose of a particle inspection function or the like. In addition, there is adopted a method of performing defect inspection with high detection sensitivity by easily correcting out-of-focus of transmitted illumination light by a variation in a mask thickness.

In the die-to-database comparison inspection, an increase in the amount of design data is progressing along with the miniaturization of patterns. Thus, it is difficult to generate design data or reference image data in real time.

That is, in order to perform the die-to-database comparison inspection, it is necessary to process a huge amount of data at a high speed, and it is therefore difficult to match a reference image generation with a scan speed for acquiring an optical image.

On the other hand, since an increase in the capacity of the storage is progressing, it is possible to store large amounts of data. Therefore, instead of a method of comparing a reference image with an optical image in real time, JP 2010-071893 A discloses an entire image acquisition and inspection method of acquiring an optical image of an entire inspection region and comparing the acquired optical image with a reference image in an offline manner, that is, not in real time.

In order to perform the die-to-database comparison inspection in real time, it is necessary to process a huge capacity of data at a high speed, and it is difficult to match a reference image generation with a scan speed for acquiring an optical image. However, since an increase in the capacity of the storage is progressing, storing large capacity data has become easy.

As described above, instead of a method of comparing a reference image with an optical image in real time, there is disclosed an entire image acquisition and inspection method of acquiring an optical image of an entire inspection region and comparing the acquired optical image with a reference image in an offline manner, that is, not in real time. Therefore, it is considered that the entire image acquisition and inspection method takes advantage of the fact that a sensor image, that is, an optical image is previously acquired.

The present invention has been made in view of these points and is directed to provide a mask inspection apparatus and a mask inspection method, which can generate a high-accuracy reference image by using an optical image previously acquired in an entire image acquisition and inspection method and can improve the inspection accuracy of die-to-database comparison inspection.

SUMMARY OF THE INVENTION

According to one aspect of the present invention, a mask inspection apparatus includes an optical image, a reference image generation unit, and a defect detection unit. The optical image acquisition unit acquires an optical image of a pattern formed in a mask by irradiating light. The reference image generation unit generates a reference image corresponding to the optical image from design data of the pattern based on a preconfigured inspection condition of a predetermined portion. The defect detection unit includes a first memory region, a second memory region, an inspection condition reconfiguring unit, and a comparison unit. The first memory region stores the reference image. The second memory region stores the optical image. The inspection condition reconfiguring unit obtains a difference between gray scales of a predetermined portion of the stored optical image and a portion of the stored reference image corresponding to the predetermined portion of the stored optical image. The existence of the defect is determined in the case where the difference is larger than a first threshold value. Further in the case where the number of defects is larger than a second threshold value, the inspection condition is reconfigured and the reference image is regenerated. The comparison unit compares the stored reference image with the stored optical image in the case where the inspection condition is not reconfigured, and compares the regenerated reference image with the stored optical image in the case where the inspection condition is reconfigured.

According to another aspect of the present invention, a mask inspection method for inspecting a defect of a pattern formed in a mask by irradiating light onto the mask, includes storing an optical image of the pattern acquired by irradiating the light to the mask, and storing a reference image generated from design data of the pattern based on a preconfigured inspection condition of a predetermined portion. A difference is obtained between gray scales of a predetermined portion of the stored optical image and a portion of the stored reference image corresponding to the predetermined portion of the stored optical image. The existence of the defect is determined in the case where the difference is larger than a first threshold value. Further in the case where the number of defects is larger than a second threshold value, the inspection condition is reconfigured and the reference image is regenerated. The stored reference image is compared with the stored optical image in the case where the inspection condition is not reconfigured, and the regenerated reference image is compared with the stored optical image in the case where the inspection condition is reconfigured.

DETAILED DESCRIPTION OF THE EMBODIMENT

Figure 1:
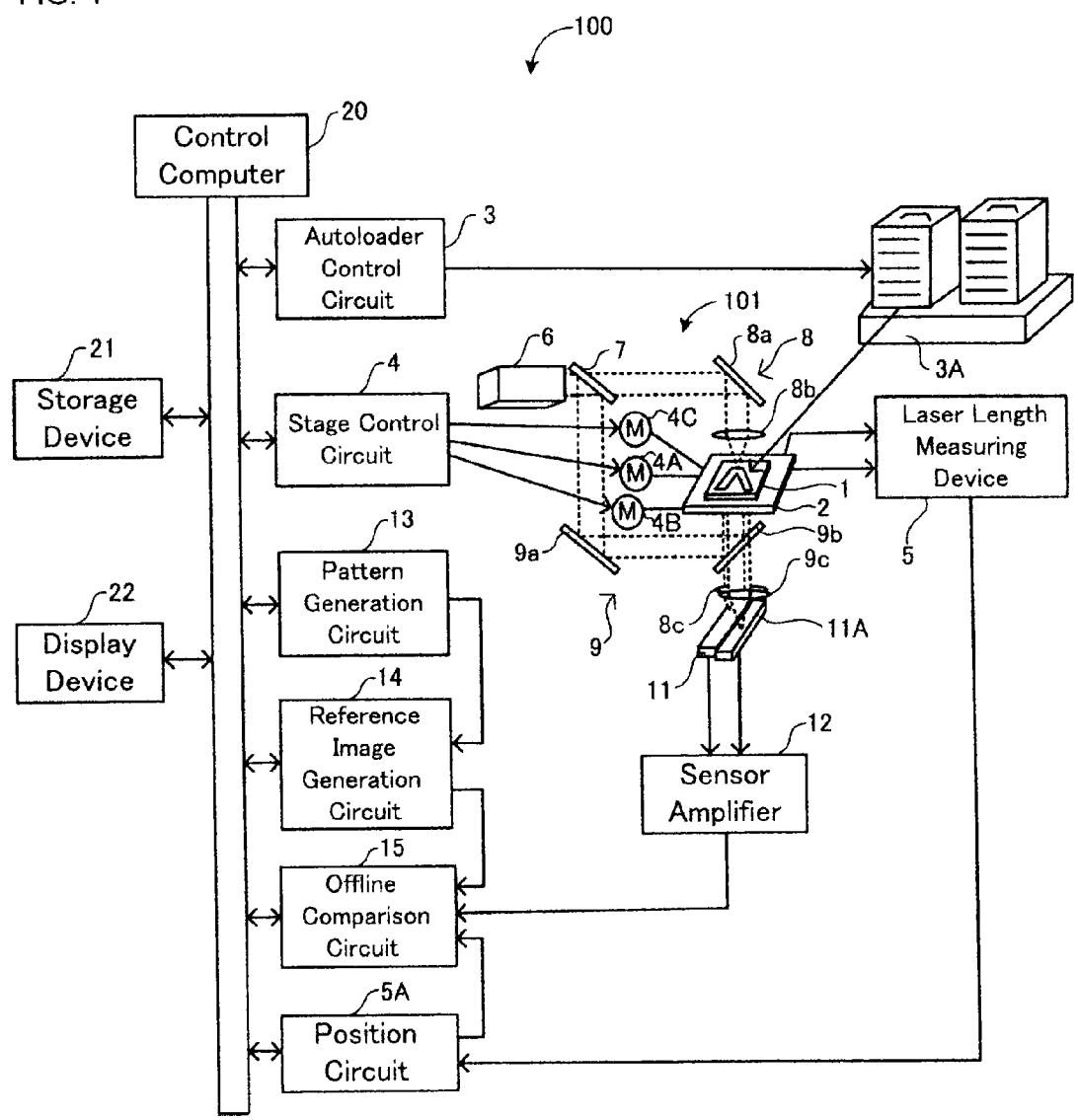
FIG. 1 is a schematic diagram illustrating a configuration of a mask inspection apparatus according to the present embodiment.

The embodiments will now be described with reference to the accompanying drawings, wherein the same reference numerals designate corresponding or identical elements throughout the various drawings.

FIG. 1 is a schematic diagram illustrating a configuration of a mask inspection apparatus 100 as one embodiment of a mask inspection apparatus according to the present invention.

In the mask inspection apparatus 100, a light is irradiated on the mask 1 to inspect defects of patterns formed in the mask 1 as shown in FIG. 1. In FIG. 1, a configuration unit necessary in the present embodiment is illustrated. However, another well-known configuration unit necessary for an inspection may also be included. As used herein, a "unit" or "circuit" can be configured by a program operating on a computer. Alternatively, the "unit" or "circuit" may be constructed by, not only a software program, but also a combination of software, hardware, or firmware. In the case that the "unit" or "circuit" may be constructed by a program, the program can be recorded in a recording device such as a magnetic disk device.

As shown in FIG. 1, the optical image acquisition unit 210 for acquiring an optical image includes a stage 2, an auto-loader control circuit 3, an autoloader 3A, a stage control circuit 4, motors 4A, 4B, 4C, a laser length measuring device 5, a position circuit 5A, a light source 6, a beam splitter 7, optical systems 8, 9, TDI sensors 11, 11A, and a sensor amplifier 12. Each component of the mask inspection system 100 will be described as follows.

The mask inspection apparatus 100 includes a stage 2 that holds the mask 1 as an inspection target. The mask 1 is conveyed on the stage 2 from an auto-loader 3. The auto-loader 3A is controlled by an auto-loader control circuit 3.

The stage 2 is driven in an X-direction, a Y-direction, and a θ direction by an X-direction motor 4A, a Y-direction motor 4B, and a θ-direction (horizontal rotating direction) motor 4C, as an example of a driving unit. The driving control of the motors 4A, 4B, and 4C is performed by a stage control circuit 4.

For example, positions of the stage 2 in the X-direction and Y-direction are detected by a laser length measuring device 5 such as a laser interferometer, and a position circuit 5A connected to the laser length measuring device 5. For example, the optical images of the mask 1 are acquired by the sensor while the mask 1 continuously moves at a constant speed in the X-direction. After the mask 1 is moved to the Y-direction at the end (stripe end), the optical images are then acquired by the sensor while the mask 1 continuously moves at a constant speed in a direction opposite to the X-direction. By repeating this process, the optical images of whole inspection region of the mask 1 are acquired by the sensor.

The mask inspection apparatus 100 also includes a light source 6 to emit a laser beam as an example of a light irradiation device. The mask inspection apparatus 100 includes an optical system 8 that transmits the laser beam emitted from the light source 6 by irradiating the laser beam on the mask 1 through a beam splitter 7, and an optical system 9 that reflects the laser beam emitted from the light source 6 by irradiating the laser beam on the mask 1 through the beam splitter 7.

The optical system 8 includes a mirror 8a, an objective lens 8b, an objective lens 8c that forms an image with transmitted light on a TDI sensor 11 as an example of an image sensor. The optical system 9 includes a mirror 9a, a beam splitter 9b, an objective lens 9c that forms an image with reflected light on a TDI sensor 11A as an example of an image sensor. Hereinafter, in a case where there is no need to distinguish the optical system 8 from the optical system 9, the same descriptions as the configuration of the optical system 8 will be used for the optical system 9.

The TDI sensor 11 is comprised of a two-dimensional CCD sensor having an imaging region of 2,048 pixels×512 pixels (144 μm×36 μm in a case where 1 pixel is 70 nm×70 nm), as one example. That is, the TDI sensor 11 is configured by a plurality of stages (for example, 512 stages) of lines in a TDI direction. Each of the lines L is configured by a plurality of pixels (for example, 2,048 pixels).

The TDI sensor 11 is installed such that the TDI direction (direction of 512 stages) of the TDI sensor 11 is matched with the X-direction of the stage 2, and the TDI sensor 11 is moved relative to the mask 1 in response to the movement of the stage 2. In this way, the pattern of the mask 1 is captured by the TDI sensor 11.

When the moving direction of the stage 2 is reversed, the movement of the TDI sensor 11 is also reversed, as the result, the TDI sensor 11 is moved relative to the mask 1. In the mask inspection apparatus 100 according to the present embodiment, the TDI sensor 11 is used as the image sensor, however another sensor such as a line sensor or an area sensor may be used instead of the TDI sensor 11.

The TDI sensor 11 is connected to the sensor amplifier 12. The sensor amplifier 12 normalizes the light quantity signal of each pixel that is input from the TDI sensor 11. The optical image, which is output from the sensor amplifier 12, is input to the offline comparison circuit 15, which is an example of the offline comparison unit, along with data indicating the position of the mask 1 at the stage 2, which is output from the position circuit 5A. In the present embodiment, the offline comparison circuit 15 is the configuration of the mask inspection apparatus as an example of an offline comparison unit which is a defect detection unit, but is not limited thereto. For example, the offline comparison unit may be an offline comparison device of an independent configuration.

Figure 2:
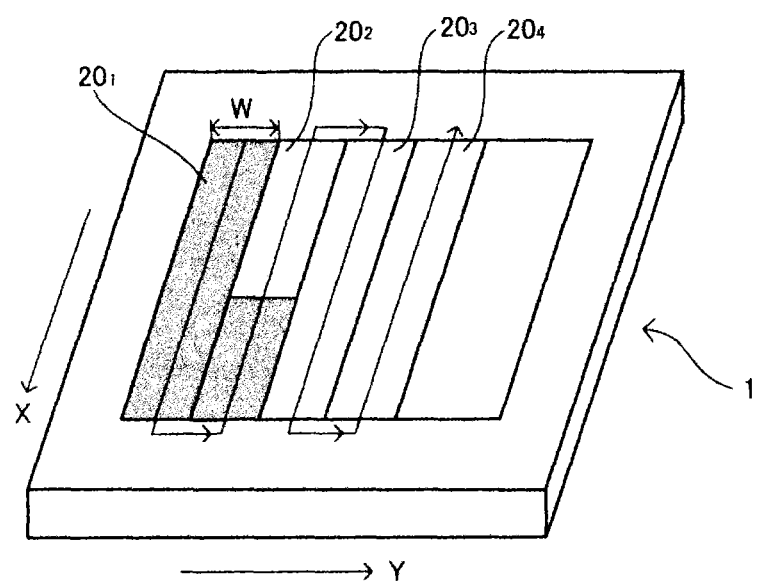
FIG. 2 is a schematic diagram illustrating an acquisition procedure of an optical image.

FIG. 2 is a schematic view illustrating an optical image acquisition procedure for the pattern formed in the mask 1. The procedure wherein the mask inspection apparatus 100 acquires an optical image of the pattern formed in the mask 1 will be described.

It is assumed that the mask 1 as shown in FIG. 2 is positioned on the stage 2 as shown in FIG. 1. The inspection region in the mask 1 is virtually divided into the strip-shaped multiple inspection regions, namely, stripes $20_1$, $20_2$, $20_3$, $20_4$, . . . as illustrated in FIG. 2. For example, each stripe is a region having the width of several hundred micrometers and the length of about 100 mm corresponding to the total length in the X-direction or Y-direction of the mask 1.

The optical image is acquired in each stripe. That is, in acquiring the optical image as shown in FIG. 2, the operation of the stage 2 is controlled such that each stripe $20_1$, $20_2$, $20_3$, $20_4$, . . . is continuously scanned. Specifically, the optical image of the mask 1 is acquired while the stage 2 is moved in the −X-direction as shown in FIG. 2. The image having a scan width W as shown in FIG. 2 is continuously input to the TDI sensor 11 as shown in FIG. 1.

That is, the image of the second stripe $20_2$ is acquired after the image of the first stripe $20_1$ is acquired. In this case, after the stage 2 moves in the −Y-direction in a stepwise manner, the optical image is acquired while the stage 2 moves in the direction (X-direction) opposite to the direction (−X-direction) in which the image of the first stripe $20_1$ is acquired, and the image having the scan width W is continuously input to the TDI sensor 11.

In the case that the image of the third stripe $20_3$ is acquired, after moving the stage 2 in the −Y-direction in the stepwise manner, the stage 2 moves in the direction opposite to the direction (X-direction) in which the image of the second stripe $20_2$ is acquired, namely, the direction (−X-direction) in which the image of the first stripe $20_1$ is acquired. An arrow shown in FIG. 2 indicates the direction and sequence for acquiring the optical image, and a hatched portion indicates the region where the optical image has already been acquired.

The pattern images formed in the TDI sensors 11 as shown in FIG. 1 are subjected to photoelectric conversion, and then they are then subjected to A/D (Analog to Digital) conversion by the sensor amplifier 12. After that, the sensor data (transmission optical image and reflection optical image) subjected to A/D conversion is sent from the sensor amplifier 12 to the offline comparison circuit 15 as shown in FIG. 1.

Next, a reference image generation circuit as one example of a reference image generation unit will be described. As shown in FIG. 1, the mask inspection apparatus 100 also includes a pattern generation circuit 13, and a reference image generation circuit 14 for generating a reference image with which the optical image is compared.

The pattern generation circuit 13 generates CAD data (drawing data) or the like stored in the storage device 21 and outputs the generated data to the reference image generation circuit 14. That is, the pattern generation circuit 13, for example, reads design data from the storage device 21 through the control computer 20 and converts it into 2-bit or other multiple-bit image data (design image data).

The design data converted into 2-bit or other multiple-bit image data (design image data) is sent from the pattern generation circuit 13 to the reference image generation circuit 14. The reference image generation circuit 14 performs the proper filtering to the design image data, that is, the graphic image data.

Figure 3:
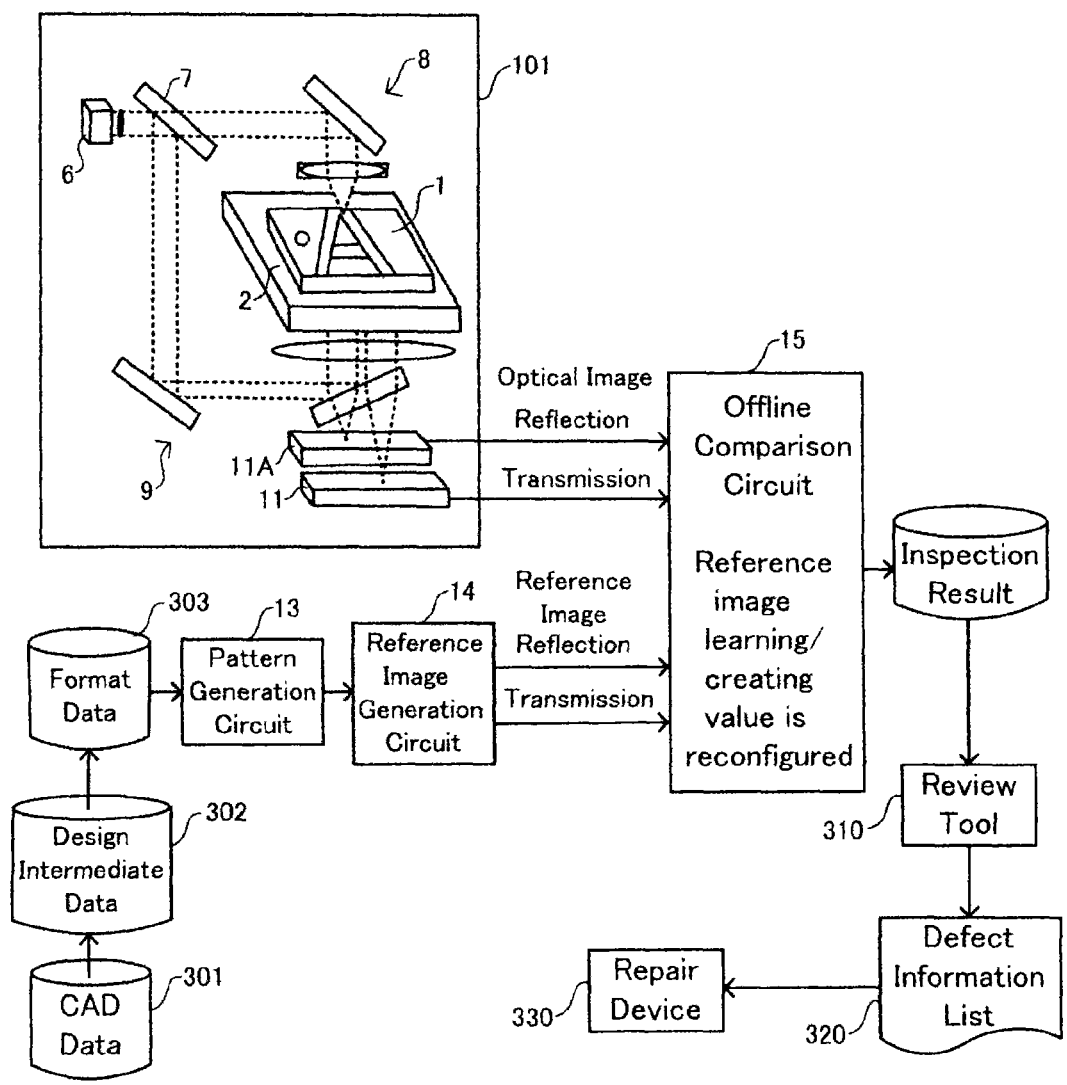
FIG. 3 is a schematic diagram illustrating a data flow according to the present embodiment.

A flow of data according to the present embodiment will be described. FIG. 3 is a schematic diagram showing the flow of data according to the present embodiment.

As shown in FIG. 3, CAD data 301 prepared by the designer (or user) is converted to design intermediate data 302 in a hierarchical format such as OASIS. The design intermediate data 302 includes data of the pattern to be formed on the mask created for each layer. The mask inspection apparatus 100 is not adapted to be able to directly read the design intermediate data 302 such as OASIS.

That is, each manufacturer of the mask inspection apparatus 100 uses different format data. Therefore, the design intermediate data 302 is converted, for each layer, to format data 303 as pattern data specific to the mask inspection apparatus 100, and the format data 303 is input to the mask inspection apparatus 100. Although the format data 303 may be data specific to the mask inspection apparatus 100, the format data 203 may also be data compatible with a writing apparatus.

The format data 303 is stored in, for example, the storage device 21 of the mask inspection apparatus 100. Further, a group of pattern features, defined in an area of approximately a few tens of micrometers square of the format data 303 is generally referred to as a "cluster" or "cell". It is common practice that the data is defined in a hierarchical structure using clusters or cells. A cluster or cell, which contains a pattern feature or features, may be used alone or repeated at certain intervals. In the former case the coordinate positions of the cluster (or cell) on the photomask are specified, whereas in the latter case the coordinate positions of each repeated cluster (or cell) are indicated together with a repetition instruction.

Each cluster or cell is disposed in a strip-shaped region, referred to as a "frame" or "stripe", having a width of a few hundreds of micrometers and a length of approximately one hundred millimeters which correspond to the total length of the photomask in the X-direction or Y-direction.

In the format data 303 (design data), which is input to the storage device 21, data of a portion necessary for a pattern being observed is read out to the pattern generation circuit 13 according to the progress of the mask inspection. The pattern generation circuit 13 interprets a graphic shape (graphic code), a graphic dimension, an arrangement position, and the like of the format data 303. The pattern generation circuit 13 then performs data generation processing to divide the pattern into an imaginary grid of squares (or grid elements) having predetermined quantization dimensions, and produces 2-bit or other multiple-bit design image data of the design pattern segment in each grid element.

The generated design image data calculates an occupancy rate occupied by the graphic in the design pattern with respect to each region (square) corresponding to the sensor pixel. The occupancy rate of the graphic in each pixel is a pixel value. The pattern data converted into the 2-bit or other multiple-bit image data (bit pattern data) as described above is transmitted to the reference image generation circuit 14 that generates reference data (reference image). The reference image generation circuit 14 generates reference pattern by performing appropriate image filter processing for comparison with a mask observation image.

Figure 4:
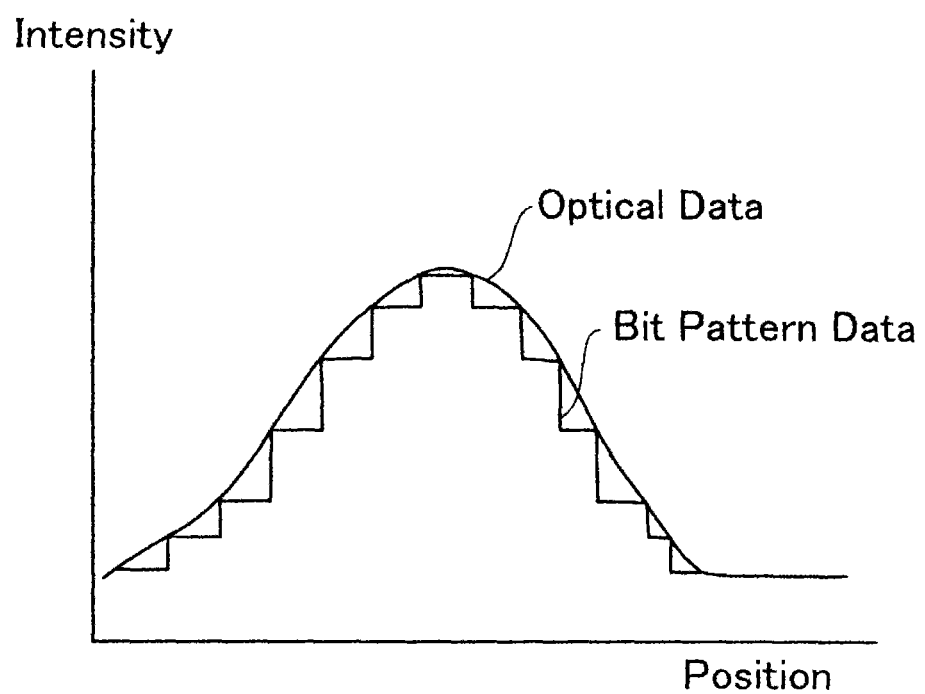
FIG. 4 is a diagram illustrating a filtering process.

FIG. 4 is a diagram illustrating the filtering process. The line width of the pattern of the mask 1 is sometimes adjusted in the production process to form the finished dimension according to the designed dimension. Further, a corner of the pattern sometimes becomes bent in the mask production process. Accordingly, the optical image (mask observation image) to be observed by the inspection apparatus is not exactly the same as the design pattern. Therefore, the filtering process is performed so that a reference image similar to the optical image is generated.

Moreover, the optical image (mask observation image) output from the sensor amplifier 12 is somewhat "blurred" due to the resolution characteristics of the enlarged optical system and due to the aperture effect in the photodiode array, that is, this optical image is a spatially low-pass filtered image.

By performing the filtering process to the design pattern data that is 2-bit or other multiple-bit image data at the design side, that is, performing a process so that the design pattern data matches to the optical image, the reference image that could be compared with the optical image with high accuracy, is generated. Accordingly, the mask 1 to be inspected is observed before the inspection, thereby a filtering coefficient that simulates the change due to the production process of the mask 1 and the optical system of the inspection apparatus, is obtained. A two-dimensional digital filtering process is then performed to the design pattern data to make the reference image similar to the optical image.

A parameter, which is used in the filter processing, is used as the inspection condition of the mask inspection apparatus 100. In addition, the parameter is also used to estimate the inspection condition. In the present embodiment, the estimation of the inspection condition is assumed as reference image learning/creating estimation.

The reference image learning/creating estimation is, for example, a process of estimating a blurring amount and a rounding amount by using a gray scale value so as to approximate the optical image in the generation of the reference image. Also, in the reference image learning/creating estimation, a predetermined point (location/place) is configured. That is, the reference image is generated from design data of the pattern based on a preconfigured inspection condition of a predetermined portion of the pattern formed in the mask.

By configuring an estimate value from this point, for example, values such as 1 to 10, the blurring amount and the rounding amount are configured so as to approximate the optical image. The parameter of the reference image learning/creating estimation is assumed as the blurring amount and the rounding amount, but is not limited thereto. Other appropriate parameters may be used.

Figure 5:
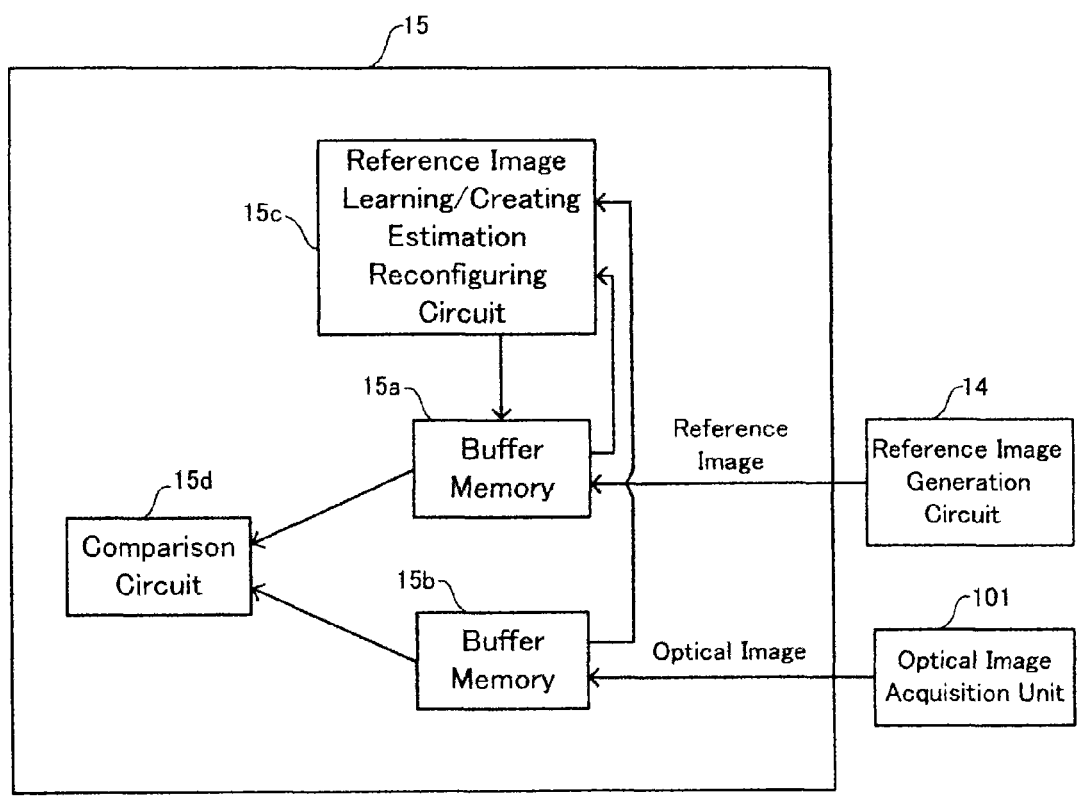
FIG. 5 is a schematic diagram illustrating a construction of the offline comparison unit according to the present embodiment.

Next, the offline comparison circuit 15 will be described with reference to FIG. 5. The reference image, which is generated by performing the filter processing all together in the reference image generation circuit 14, is input to the offline comparison circuit 15. In addition, the optical image, which is acquired by the optical image acquisition unit 101, is input to the offline comparison circuit 15.

The offline comparison circuit 15 includes a buffer memory 15a as a first memory region that stores the reference image, a buffer memory 15b as a second memory region that stores the optical image, a reference image learning/creating estimation reconfiguring circuit 15c as an inspection condition reconfiguring unit that reconfigures the inspection condition by using predetermined search regions of the buffer memories 15a and 15b, and a comparison circuit 15d as a comparison unit that compares the reference image stored in the buffer memory 15a with the optical image stored in the buffer memory 15b in an offline manner.

The buffer memories 15a and 15b are each configured such that the inspection regions, for example, the reference image and the optical image of stripe unit are sequentially stored therein and the reference image and the optical image of the entire mask 1 are stored therein. The pattern defect inspection of the mask 1 is performed in an offline manner by using the reference image and the optical image of the entire mask 1, which are each stored in the buffer memories 15a and 15b.

The offline comparison differs to the comparison in real time, in which the optical image is compared with the reference image while the optical image is acquired and the reference image is generated. In the offline comparison, for example, the optical images of the whole pattern and the reference images corresponding to the optical image are stored in the buffer memories, thereafter, the optical images and the reference images are compared.

As described above, in order to perform the die-to-database comparison inspection in real time, it is necessary to process a huge capacity of data at a high speed, and it is difficult to match a reference image generation with a scan speed for acquiring an optical image. On the other hand, since an increase in the capacity of the storage is progressing, storing large capacity data has become easy. Accordingly, the acquiring step of the optical image can be performed separately to the comparing step in the offline comparison, and thus efficiently perform inspection.

In the present embodiment, before the reference image and the optical image each stored in the buffer memories 15a and 15b are input to the comparison circuit 15d and compared with each other, the predetermined search regions of the reference image and the optical image each stored in the buffer memories 15a and 15b are input to the reference image learning/creating estimation reconfiguring circuit 15c.

The predetermined search regions are, for example, specific regions when the mask inspection process reaches a predetermined region, and are stripe unit or the like.

The reference image learning/creating estimation reconfiguring circuit 15c calculates a difference between the specific regions of the reference image and the optical image transmitted from the buffer memories 15a and 15b (maximum difference between the gray scale value of the reference image and the gray scale value of the optical image in the predetermined region). When the difference is greater than a threshold value (a first threshold value), the mask inspection condition is reconfigured by the reference image learning/creating estimation, according to the difference. Specifically, a difference between gray scales of predetermined search regions of the reference image stored in the buffer memory 15a and the optical image stored in the buffer memory 15b, is obtained. In a case where the difference between gray scales is greater than the first threshold value, the existence of a defect in the search region is determined. Furthermore, in a case where the number of the defects is greater than a second threshold value, the mask inspection condition is reconfigured.

For example, in cases where the difference between the reference image and the optical image in the specific regions is greater than the certain threshold value, the reference image learning/creating estimation reconfiguring circuit 15c determines the cases as the defects. In a case where the number of the defects is greater than the certain threshold value, the reconfiguring of the mask inspection condition is performed by adding a predetermined point to the point (location/position) determined by the reference image learning/creating estimation, and a new reference image is generated from the estimate value and the reference image stored in the buffer memory 15a.

When the pattern in the specific regions includes a plurality of pattern groups containing a pattern group including diagonal pattern mixture, a pattern group including a vertical and horizontal pattern mixture, and a pattern group including either a vertical or horizontal pattern only, the difference may be found in the order of priority of "a diagonal pattern mixture", "a vertical and horizontal pattern mixture", and "either a vertical or horizontal pattern only". In addition, the reconfiguring of the reference image learning/creating estimation is configured to be automatically performed, but the reference image learning/creating estimation may be reconfigured by an input of an operator.

Thereafter, the newly generated reference image stored in the buffer memory 15a and the optical image stored in the buffer memory 15b are input to the comparison circuit 15d.

The comparison circuit 15d compares the optical image input from the buffer memory 15b with the reference image input from the buffer memory 15a. The comparison circuit 15d detects a shape defect of the pattern based on the shape difference of the pattern between the optical image and the reference image, and specifies the coordinate of the defect which is determined by the comparison.

The inspection result of the comparison circuit 15d, for example, can be stored in the storage device 21, and the operator can then confirm the inspection result by reading the stored inspection result from the storage device 21 and displaying the read inspection result on the display device 22 such as a monitor. The storage device 21 is, for example, a magnetic disk device, a magnetic tape device, an FD, a semiconductor memory, or the like.

In the comparison circuit 15d, a comparison determination algorithm is used in which transmission images and reflection images are combined. As a result of the comparison, in the case that a difference between the two exceeds a predetermined threshold, the position is determined to be a defect. Furthermore, rather than transmission images and reflection images being combined, a transmission image can be compared to another transmission image, or a reflection image can be compared to another reflection image.

Next, the inspection result stored is transmitted to, for example, a review tool 310 as shown in FIG. 3 for review by an operator. The review tool 310 may be one of the components included in the inspection apparatus 100. Alternatively, the review tool 310 may be an external device of the inspection apparatus 100.

The term "review" as used herein means an operation performed by an operator to determine whether a detected defect can be tolerated. That is, the operator compares the reference image as the basis for the defect determination with the optical image including the defect to determine whether the defect requires repair.

The defect information specified in the review tool 310 is stored in the storage device 21, for example. When even one defect to be repaired is confirmed in the review tool 310, the mask 1 is sent to a repair device 330, which is an external device of the mask inspection apparatus 100, along with a defect information list 320 as shown in FIG. 3. Since the repair method is different according to the type of the defect, for example, between the extrusion and intrusion defects, the type of the defect including discrimination between the extrusion and intrusion defects and the coordinate of the defect are added to the defect information list 320.

Figure 6:
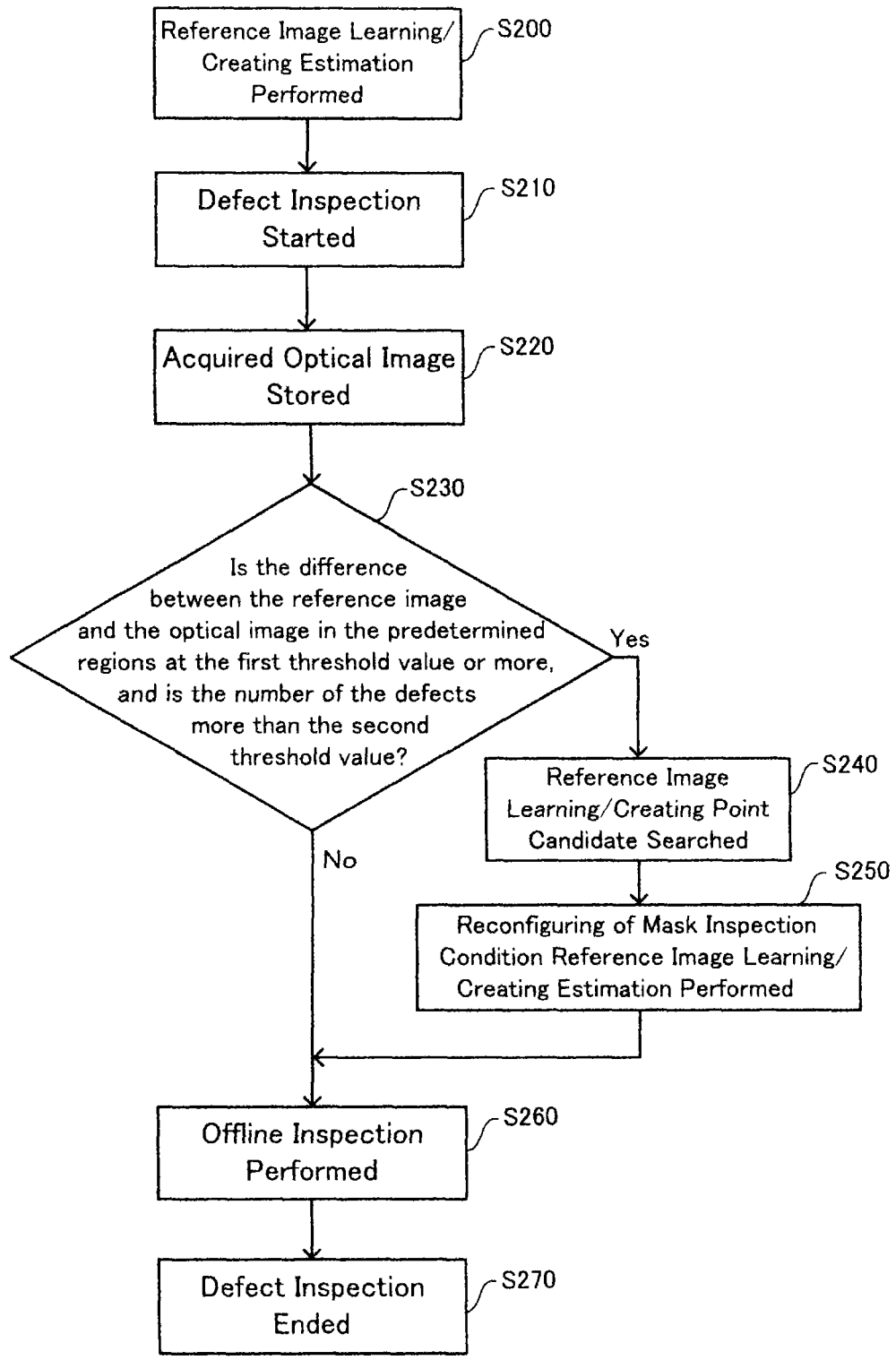
FIG. 6 is a flowchart illustrating the mask inspection process according to the present embodiment.

Next, the mask inspection process according to the present embodiment will be described referring to FIG. 6. FIG. 6 is a flowchart illustrating the mask inspection process according to the present embodiment.

In the present embodiment, the reference image learning/creating estimation is performed (step S200). The reference image learning/creating estimation is an example of an inspection condition estimation and is intended to avoid a false defect occurring in the comparison between the reference image and the optical image. As described above, the reference image learning/creating estimation is a blurring amount estimation of an edge and a rounding amount estimation of a corner, and the point corresponds to, for example, the gray scale value (0 to 255).

Next, the defect inspection to be performed to the mask positioned on the stage 2 is started (step S210).

In step S210, the defect inspection is started. When the optical image of the mask 1 is acquired by the optical image acquisition unit 101, the acquired optical image is input to the offline comparison circuit 15 and is stored in the buffer memory 15b (step S220). At this time, the reference image, which is generated by the reference image generation circuit 14, is also input to the offline comparison circuit 15 and is stored in the buffer memory 15a.

Thereafter, the predetermined search regions stored in the buffer memory 15a, that is, the reference image of the specific region, and the optical image of the specific region stored in the buffer memory 15b are input to the reference image learning/creating estimation reconfiguring circuit 15c and are compared with each other (step S230).

In step S230, the reference image and the optical image of the specific region are compared with each other, and a difference of the comparison result is obtained. In cases where the difference is greater than a certain threshold value (the first threshold value), the cases are determined as the defects. Then, when the number of the defects is greater than a certain threshold value (the second threshold value), the process proceeds to step S240.

On the other hand, in step S230, when the difference is less than the certain threshold value (the first threshold value) or when the number of the defects determined as being great is less than the certain threshold value (the second threshold value), the process proceeds to step S260.

Thereafter, the reference image learning/creating point candidate is searched (step S240). For example, the reference image learning/creating point candidate, in which the difference between the reference image and the optical image of the specific region is less than the certain threshold value, is searched.

Thereafter, a new reference image is generated from the reference image stored in the buffer memory 15a by using the reference image learning/creating point candidate searched in step S240, that is, the mask inspection condition is reconfigured by adding a predetermined point to the point of the reference image learning/creating estimation performed in step S200 (step S250).

Thereafter, in step S250, the reference image, which is stored in the buffer memory 15a and to which the reference image learning/creating estimation is reconfigured, and the optical image, which is stored in the buffer memory 15b, are input to the comparison circuit 15d and the defect inspection is performed in an offline manner (step S260).

In addition, in step S230, when the difference between the gray scales in the predetermined region is less than the certain threshold value (the first threshold value) or when the number of the defects determined as being great is less than the certain threshold value (the second threshold value), the defect inspection is performed in an offline manner (step S260).

In step S260, the comparison between the reference image and the optical image is performed by the comparison circuit 15d and the defect inspection is ended (step S270). Coordinates of the position determined as the defect in the defect inspection are specified and the inspection result is stored in the storage device 21.

Next, another embodiment of the present invention will be described referring to FIGS. 7 and 8.

Figure 7:
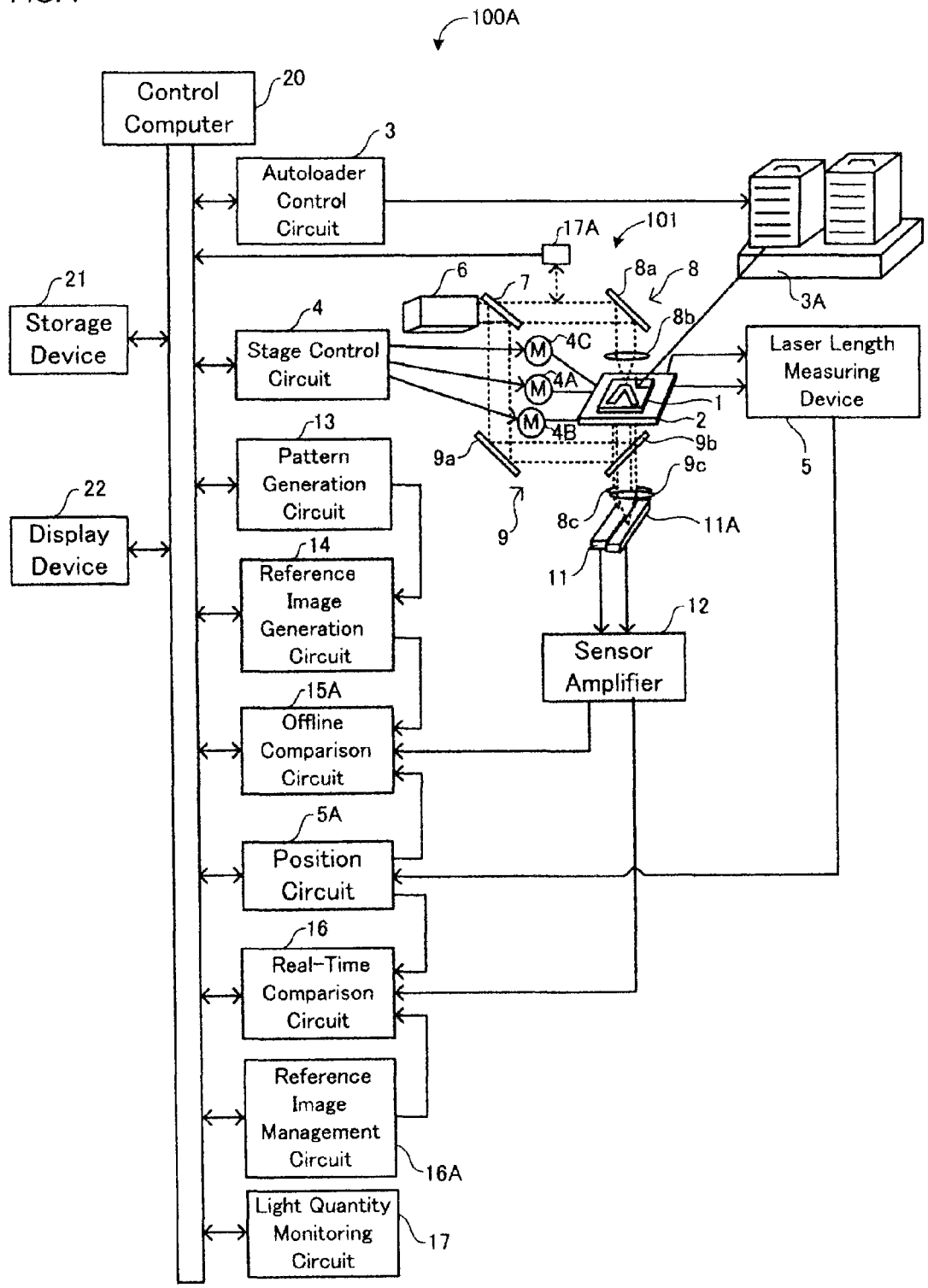
FIG. 7 is a schematic diagram of another example of the mask inspection apparatus according to the present embodiment.

A mask inspection apparatus 100A of FIG. 7 according to another embodiment has the same structure as the mask inspection apparatus 100 of the present embodiment and further includes a real-time comparison circuit 16 as an example of a real-time comparison unit, a reference image management circuit 16A as an example of a reference image management unit, a light quantity monitoring circuit 17 as an example of a light quantity monitoring unit, and a light quantity sensor 17A.

Figure 8:
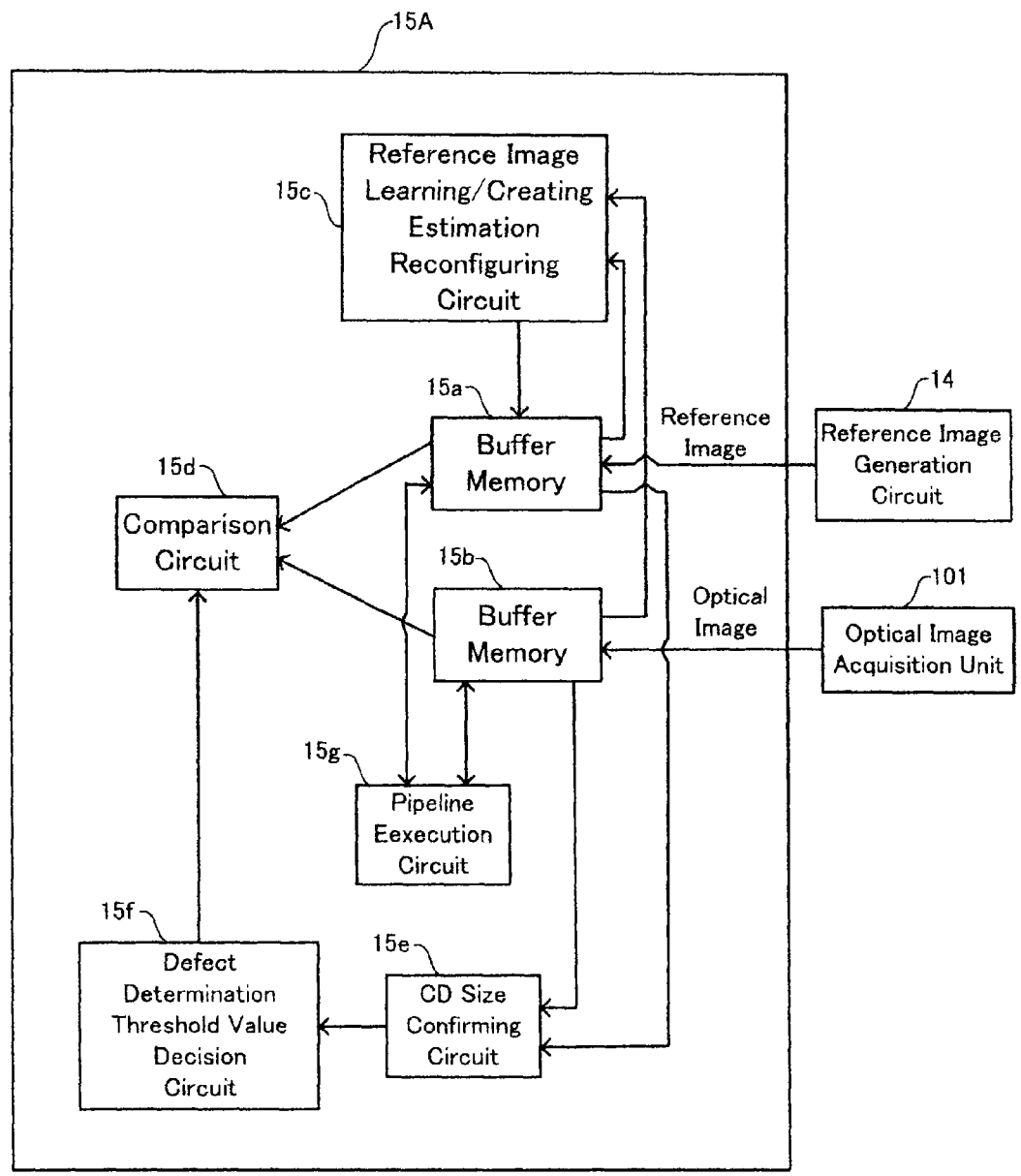
FIG. 8 is a schematic diagram illustrating another example of the offline comparison circuit according to the present embodiment.

In addition, the mask inspection apparatus 100A includes an offline comparison circuit 15A illustrated in FIGS. 7 and 8. The offline comparison circuit 15A has the same structure as the offline comparison circuit 15 and further includes a critical dimension (CD) size confirming circuit 15e as an example of a CD size confirming unit, a defect determination threshold value decision circuit 15f as a defect determination threshold value decision unit, and a pipeline execution circuit 15g as an example of a pipeline execution unit. Hereinafter, a new configuration of the mask inspection apparatus 100A will be described.

The real-time comparison circuit 16 illustrated in FIG. 7 receives the optical image acquired by the optical image acquisition unit 101 and receives the reference image discretely generated from the reference image generation circuit 14 at the same time as the acquisition of the optical image.

Then, the reference image and the optical image, which are input to the real-time comparison circuit 16, are compared with each other and the defect inspection is performed in real time. The offline comparison circuit 15A stores the reference image and the optical image of the entire mask 1 and sequentially compares the entire mask 1, however the real-time comparison circuit 16 uses the discretely generated reference image.

In addition, the mask inspection apparatus 100A includes a reference image management circuit 16A. The reference image management circuit 16A confirms the creation of the discretely generated reference image at regular intervals, and a creating frequency of the reference image is managed according to the creation of the reference image.

That is, the reference image management circuit 16A performs management such that the reference image generation is matched with the scan speed at which the optical image is acquired by the real-time comparison circuit 16 and outputs the managed reference image to the real-time comparison circuit 16. Due to such a configuration, the die-to-database comparison can be performed in real time, and the detection of focus error, alignment error, and the like can also be performed during the inspection.

In addition, as illustrated in FIG. 7, the mask inspection apparatus 100A includes the light quantity monitoring circuit 17 and the light quantity sensor 17A that measures the light quantity of light emitted from the light source 6.

The light quantity monitoring circuit 17 is a circuit that monitors the light quantity measured by the light quantity sensor 17A. When an amount of a decrease in the light quantity measured by the light quantity sensor 17A is greater than a certain threshold value (a third threshold value), the defect inspection of the mask 1 is configured to be stopped by the mask inspection apparatus 100A. Due to such a configuration, the acquisition error of the optical image is detected during the inspection.

FIG. 8 is a schematic diagram illustrating the offline comparison circuit 15A.

The offline comparison circuit 15A includes a buffer memory 15a that stores the reference image, a buffer memory 15b that stores the optical image, a reference image learning/creating estimation reconfiguring circuit 15c that reconfigures the reference image learning/creating estimation by using the specific regions of the reference image and the optical image before the comparison in the comparison circuit 15d, the comparison circuit 15d that compares the reference image stored in the buffer memory 15a with the optical image stored in the buffer memory 15b in an offline manner, a CD size confirming circuit 15e, a defect determination threshold value decision circuit 15f, and a pipeline execution circuit 15g. Hereinafter, the CD size confirming circuit 15e, the defect determination threshold value decision circuit 15f, and the pipeline execution circuit 15g will be described.

The CD size confirming circuit 15e confirms the CD size of each pattern by using the reference image stored in the buffer memory 15a and the optical image stored in the buffer memory 15b. The confirmed CD size is input to the defect determination threshold value decision circuit 15f. The defect determination threshold value decision circuit 15f decides the threshold value of the defect determination according to the input CD size and outputs the decided threshold value to the comparison circuit 15d. The CD (critical dimension) is a dimension of a pattern drawn in the mask 1. For example, in the case of a line pattern, the CD is a line width of the line pattern.

Since the offline comparison circuit 15A includes the CD size confirming circuit 15e and the defect determination threshold value decision circuit 15f, it is possible to suppress the occurrence of a false defect caused by a change (thickening or thinning) in the line width occurring in a specific drawing region.

In addition, even in the phenomenon that the dimension of the pattern of the optical image is different from the dimension of the pattern of the design data, that is, the pattern of the reference image, a deviation may occur in the line widths of the patterns of the optical image and the reference image. As a result, there is a problem that the pattern unnecessary to be detected as the defect is detected as a false defect. For such a problem, the CD size confirming circuit 15e and the defect determination threshold value decision circuit 15f are configured to decide the threshold value of the comparison circuit 15d so as to suppress the occurrence of the false defect.

The pipeline execution circuit 15g causes the comparison circuit 15d to execute the comparison when the reference image stored in the buffer memory 15a and the optical image stored in the buffer memory 15b reach a certain region of an inspection region, wherein "an inspection region" means a region where the pattern to be inspected is formed in the mask.

That is, the pipeline execution circuit 15g executes the pipeline processing with respect to the stored certain region before the reference image and the optical image of the entire mask 1 are stored in the buffer memories 15a and 15b, inputs the certain region to the comparison circuit 15d, and performs the comparison in the comparison circuit 15d.

By performing such processing, it is possible to reduce the processing time in the offline comparison circuit 15A. The pipeline processing is processing that starts to process a next instruction, for example, before a previous instruction cycle is ended.

According to the mask inspection apparatus and the mask inspection method of each of the embodiments described above, the offline comparison circuits 15 and 15A capable of comparing the reference image with the optical image in an offline manner are provided, the offline comparison circuits 15 and 15A determine whether the reference image and the optical image are compared to each other, and the reference image learning/creating estimation can be reconfigured. In these embodiments, it is possible to generate the high-accuracy reference image and improve the inspection accuracy of the die-to-database comparison inspection.

That is, the real-time comparison between the reference image and the optical image makes it difficult to match the reference image generation with the scan speed for acquiring the optical image and causes the occurrence of the false defect. However, in each of the embodiments of the present invention, by providing the reference image learning/creating estimation reconfiguring circuit 15c, it is possible to search for the optimal reference image learning/creating estimation, suppress the occurrence of the false defect, and improve the inspection accuracy of the die-to-database comparison inspection.

The present invention is not limited to the embodiments described and can be implemented in various ways without departing from the spirit of the invention.

The above description of the present embodiment has not specified apparatus constructions, control methods, etc., which are not essential to the description of the invention, since any suitable apparatus construction, control methods, etc. can be employed to implement the invention. Further, the scope of this invention encompasses all inspection methods and inspection apparatuses employing the elements of the invention and variations thereof, which can be designed by those skilled in the art.

What is claimed is:
1. A mask inspection apparatus comprising:
an optical image acquisition unit configured to acquire an optical image of a pattern formed in a mask by irradiating light;
a reference image generation unit configured to generate a reference image corresponding to the optical image from design data of the pattern based on a preconfigured inspection condition of a predetermined portion; and
a defect detection unit comprising,
a first memory region configured to store the reference image;
a second memory region configured to store the optical image
an inspection condition reconfiguring unit configured to obtain a difference between gray scales of a predetermined portion of the stored optical image and a portion of the stored reference image corresponding to the predetermined portion of the stored optical image, wherein the existence of the defect is determined in the case where the difference is larger than a first threshold value, further in the case where the number of defects is larger than a second threshold value, the inspection condition is reconfigured and the reference image is regenerated;
a comparison unit configured to compare the stored reference image with the stored optical image in the case where the inspection condition is not reconfigured, and to compare the regenerated reference image with the stored optical image in the case where the inspection condition is reconfigured.

2. The mask inspection apparatus according to claim 1, wherein the reference image generation unit generates the reference image by estimating a blurring amount of the optical image and a rounding amount of a corner of the pattern using a gray scale value of the predetermined portion so as to approximate the optical image from the design data of the pattern.

3. The mask inspection apparatus according to claim 1, wherein in the inspection condition reconfiguring unit, the number of the predetermined portions is increased, and the inspection condition is reconfigured.

4. The mask inspection apparatus according to claim 1, wherein the pattern comprises a plurality of pattern groups, and the inspection condition reconfiguring unit obtains the difference, in the order of a pattern group comprising of diagonal pattern mixture, a pattern group comprising of a vertical and horizontal pattern mixture, and a pattern group comprising of either a vertical or horizontal pattern only.

5. The mask inspection apparatus according to claim 1, wherein the defect detection unit comprises:
a CD size confirming unit configured to confirm CD sizes of each of the patterns from the stored reference image and the stored optical image; and
a defect determination threshold value decision unit configured to determine the first threshold value of the comparison of each of the patterns according to the confirmed CD size.

6. The mask inspection apparatus according to claim 1, wherein the defect detection unit comprises a pipeline execution unit configured to cause the comparison unit to perform the comparison using the stored optical image when the stored reference image and the stored optical image reach a certain region of an inspection region.

7. The mask inspection apparatus according to claim 1, wherein the reference image generation unit comprises a real-time comparison unit configured to discretely generate the reference image at the time of acquiring the optical image and compare the discretely generated reference image with the optical image in real time.

8. The mask inspection apparatus according to claim 7, further comprising a reference image management unit configured to manage a creating frequency of the reference image which is discretely generate.

9. The mask inspection apparatus according to claim 1, further comprising:
   a light quantity sensor configured to measure a light quantity of the irradiated light; and
   a light quantity monitoring unit configured to stop the mask inspection when an amount of a decrease in the measured light quantity is greater than a third threshold value.

10. The mask inspection apparatus according to claim 1, wherein in the comparison unit, the stored reference image and the stored optical image are compared offline in the case where the inspection condition is not reconfigured, and the regenerated reference image and the stored optical image are compared offline in the case where the inspection condition is reconfigured.

11. A mask inspection method for inspecting a defect of a pattern formed in a mask by irradiating light onto the mask, the method comprising:
   storing an optical image of the pattern acquired by irradiating the light to the mask, and storing a reference image generated from design data of the pattern based on a preconfigured inspection condition of a predetermined portion;
   obtaining a difference between gray scales of a predetermined portion of the stored optical image and a portion of the stored reference image corresponding to the predetermined portion of the stored optical image, wherein the existence of the defect is determined in the case where the difference is larger than a first threshold value, further in the case where the number of defects is larger than a second threshold value, the inspection condition is reconfigured and the reference image is regenerated;
   comparing the stored reference image with the stored optical image in the case where the inspection condition is not reconfigured, and comparing the regenerated reference image with the stored optical image in the case where the inspection condition is reconfigured.

12. The mask inspection method according to claim 11, wherein the reference image is generated by estimating a blurring amount of the optical image and a rounding amount of a corner of the pattern using a gray scale value of the predetermined portion so as to approximate the optical image from the design data of the pattern.

13. The mask inspection method according to claim 11, wherein the number of the predetermined portions is increased, and the inspection condition is reconfigured.

14. The mask inspection method according to claim 11, wherein the pattern comprises a plurality of pattern groups, and the difference is obtained, in the order of a pattern group comprising of diagonal pattern mixture, a pattern group comprising of a vertical and horizontal pattern mixture, and a pattern group comprising of either a vertical or horizontal pattern only.

15. The mask inspection method according to claim 11, wherein in the offline comparison, CD sizes of each of the patterns are obtained from the stored reference image and the stored optical image, and then the first threshold value of the comparison of each of the patterns is determined according to the CD size.

16. The mask inspection method according to claim 11, wherein the comparison is performed when the stored reference image and the stored optical image reach a certain region of an inspection region.

17. The mask inspection method according to claim 11, wherein the reference image is discretely generated at the time of acquiring the optical image, and then the discretely generated reference image is compared with the optical image in real time.

18. The mask inspection method according to claim 17, wherein creation of the discretely generated reference image is confirmed at regular intervals and a creating frequency of the reference image is managed according to the creation of the reference image.

19. The mask inspection method according to claim 11, wherein a light quantity of the irradiated light is measured by a light quantity sensor, and then the mask inspection process is stopped when an amount of a decrease in the measured light quantity is greater than a third threshold value.

20. The mask inspection method according to claim 11, wherein the stored reference image and the stored optical image are compared offline in the case where the inspection condition is not reconfigured, and the regenerated reference image and the stored optical image are compared offline in the case where the inspection condition is reconfigured.

* * * * *